US012617713B2

(12) United States Patent
Hara et al.

(10) Patent No.: US 12,617,713 B2
(45) Date of Patent: May 5, 2026

(54) SUBSTRATE, METHOD FOR PRODUCING SUBSTRATE, AND METHOD FOR PRODUCING UNIT CELL

(71) Applicants: National Institute of Information and Communications Technology, Tokyo (JP); TOYOBO MC Corporation, Osaka (JP)

(72) Inventors: Motoaki Hara, Tokyo (JP); Yuichiro Yano, Tokyo (JP); Tetsuya Ido, Tokyo (JP); Hikaru Tanaka, Shiga (JP); Kazutake Hagiya, Shiga (JP); Yasuhiro Sato, Osaka (JP)

(73) Assignees: NATIONAL INSTITUTE OF INFORMATION AND COMMUNICATIONS TECHNOLOGY, Tokyo (JP); TOYOBO MC CORPORATION, Osaka (JP)

( * ) Notice: Subject to any disclaimer, the term of this patent is extended or adjusted under 35 U.S.C. 154(b) by 225 days.

(21) Appl. No.: 18/280,747

(22) PCT Filed: Jan. 27, 2022

(86) PCT No.: PCT/JP2022/003180
§ 371 (c)(1),
(2) Date: Sep. 7, 2023

(87) PCT Pub. No.: WO2022/190694
PCT Pub. Date: Sep. 15, 2022

(65) Prior Publication Data
US 2024/0150229 A1 May 9, 2024

(30) Foreign Application Priority Data
Mar. 11, 2021 (JP) ................................. 2021-039388

(51) Int. Cl.
*C03C 17/22* (2006.01)
*B32B 3/26* (2006.01)
(Continued)

(52) U.S. Cl.
CPC .............. *C03C 17/22* (2013.01); *B32B 3/266* (2013.01); *B32B 3/30* (2013.01); *B32B 17/10* (2013.01);
(Continued)

(58) Field of Classification Search
CPC . C03C 17/22; C03C 2217/28; C03C 2218/11; C03C 2218/34; C03C 2218/355;
(Continued)

(56) References Cited

U.S. PATENT DOCUMENTS 9,318,750 B2 4/2016 Nagasaka
2014/0306700 A1 10/2014 Kamada et al.
(Continued)

FOREIGN PATENT DOCUMENTS

JP 2016-029699 3/2016
JP 2016-092465 5/2016
(Continued)

OTHER PUBLICATIONS

Extended European Search Report issued Feb. 19, 2025 in corresponding European Patent Application No. 22766661.7.
(Continued)

*Primary Examiner* — Michael Maskell
(74) *Attorney, Agent, or Firm* — WENDEROTH, LIND & PONACK, L.L.P.

(57) ABSTRACT
The problem of the present invention is to provide a substrate with high versatility, a method for producing the substrate, and a method for producing a unit cell using the substrate. The problem is solved by providing a substrate
(Continued)

comprising a plurality of alkali metal azide spots on a substantially flat surface.

14 Claims, 2 Drawing Sheets

(51) Int. Cl.

| | |
|---|---|
| *B32B 3/30* | (2006.01) |
| *B32B 17/10* | (2006.01) |
| *B32B 27/28* | (2006.01) |
| *B32B 37/18* | (2006.01) |
| *B32B 38/00* | (2006.01) |
| *G04F 5/14* | (2006.01) |
| *H01S 1/06* | (2006.01) |
| *H03L 7/26* | (2006.01) |

(52) U.S. Cl.

CPC .......... *B32B 27/283* (2013.01); *B32B 37/182* (2013.01); *B32B 38/0004* (2013.01); *B32B 38/0008* (2013.01); *G04F 5/14* (2013.01); *H03L 7/26* (2013.01); *B32B 2250/03* (2013.01); *B32B 2250/40* (2013.01); *B32B 2255/20* (2013.01); *B32B 2310/0831* (2013.01); *B32B 2315/08* (2013.01); *B32B 2383/00* (2013.01); *B32B 2457/00* (2013.01); *C03C 2217/28* (2013.01); *C03C 2218/11* (2013.01); *C03C 2218/34* (2013.01); *C03C 2218/355* (2013.01); *H01S 1/06* (2013.01)

(58) Field of Classification Search

CPC ........... B32B 3/266; B32B 3/30; B32B 17/10; B32B 27/283; B32B 37/182; B32B 38/0004; B32B 38/0008; B32B 2250/03; B32B 2250/40; B32B 2255/20; B32B 2310/0831; B32B 2315/08; B32B 2383/00; B32B 2457/00; G04F 5/14; G04F 5/145; H03L 7/26; H01S 1/06; B82Y 20/00; G01R 33/26

USPC ......................................................... 250/428

See application file for complete search history.

(56) References Cited

U.S. PATENT DOCUMENTS

| | | | |
|---|---|---|---|
| 2016/0308543 A1 | 10/2016 | Ishihara | |
| 2018/0212613 A1 | 7/2018 | Ishihara | |
| 2019/0181871 A1* | 6/2019 | Matsuda | ................. G04F 5/145 |
| 2020/0002802 A1* | 1/2020 | Kitching | ................. B23K 1/20 |

FOREIGN PATENT DOCUMENTS

| | | |
|---|---|---|
| JP | 2016-207695 | 12/2016 |
| WO | 2013/072967 | 5/2013 |

OTHER PUBLICATIONS

Notice for Reasons for Refusal issued Apr. 30, 2025 in corresponding Japanese Patent Application No. 2023-505195, with English language translation.

International Search Report issued Apr. 12, 2022 in International (PCT) Application No. PCT/JP2022/003180.

Gouloumet, et al., "Progress towards a compact and low-power miniaturized Rubidium Oscillator (mRO™)", IEEE/MTT-S International Microwave Symposium, 2020, pp. 876-879.

Zhang, et al., "ULPAC: A Miniatured Ultralow-power Atomic Clock", IEEE Journal of Solid-State Circuits, 2019, vol. 54, No. 11, pp. 3135-3148.

Karlen, et al., "Lifetime assessment of $RbN_3$-filled MEMS atomic vapor cells with $Al_2O_3$ coating", Optics express, 2017, vol. 25, No. 3, pp. 2187-2194.

Liew, et al., "Wafer-level filling of microfabricated atomic vapor cells based on thin-film deposition and photolysis of cesium azide", Applied Physics Letters, 2007, vol. 90, No. 11, 114106-1 to 114106-3.

* cited by examiner

[FIG. 1]
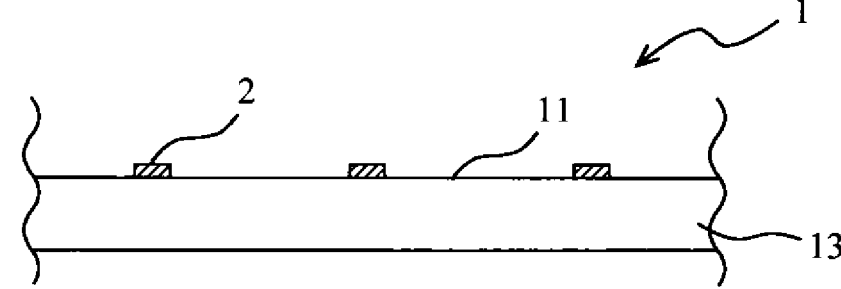
[FIG. 2]
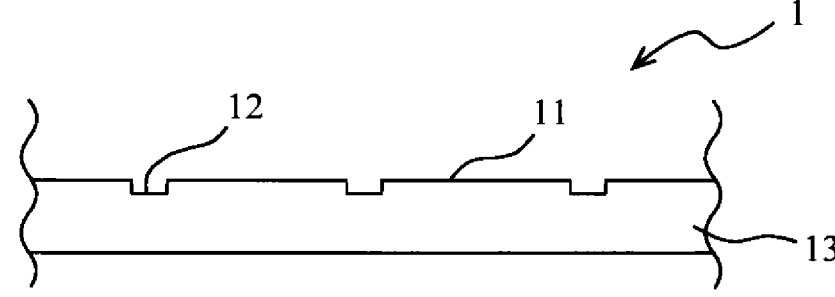
[FIG. 3]
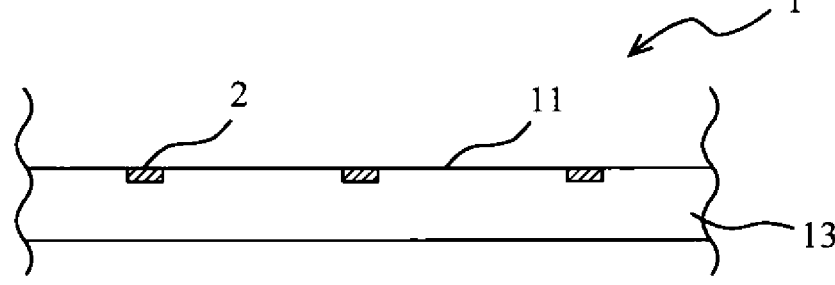

[FIG. 4]
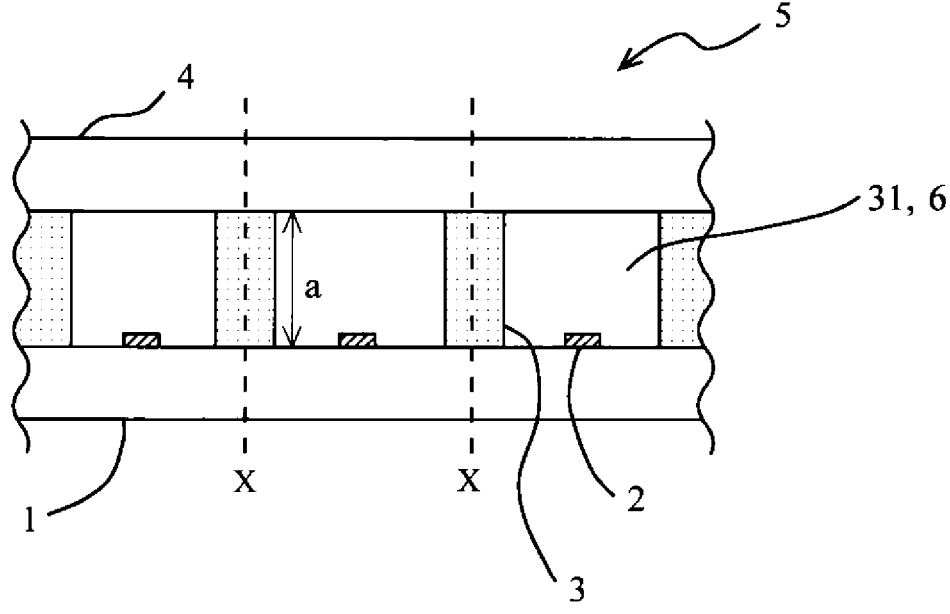
[FIG. 5]
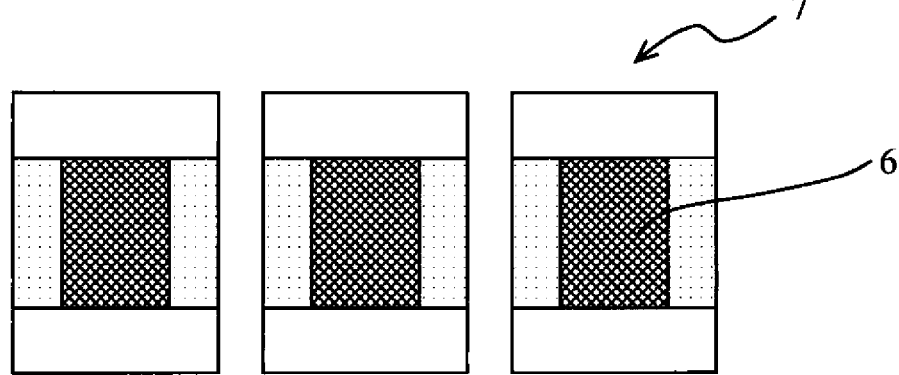

SUBSTRATE, METHOD FOR PRODUCING SUBSTRATE, AND METHOD FOR PRODUCING UNIT CELL

TECHNICAL FIELD

The present invention relates to a substrate, a method for producing the substrate, and a method for producing a unit cell using the substrate.

BACKGROUND ART

A cell in which an atomic gas is sealed (hereinafter also referred to as a gas cell) is used in an atomic device such as a high-precision atomic clock based on the frequency of an electromagnetic wave absorbed by the atom, an atomic magnetic sensor which uses optical pumping of the atom, or the like. As a production method of such a gas cell, a method is known in which a cell container is produced by glass fusion bonding or blowing, an alkali metal gas and a buffer gas are blown into the container, and the gases are sealed by pinching off (Non-Patent Documents 1 and 2).

However, the production methods disclosed in Non-Patent Documents 1 and 2 involve complicated operations, have difficulty in miniaturizing a cell, and are not suitable also for mass production. From the viewpoint of miniaturization of a cell and cost reduction through mass production, a method for producing a cell by a wafer process has been studied (Non-Patent Documents 3 and 4).

RELATED ART DOCUMENTS

Non-Patent Documents

Non-Patent Document 1: J. Gouloumet, B. Leuenberger, C. Schori, S. Grop, and R. Rochat, "Progress towards a compact and low-power miniaturized Rubidium Oscillator (mRO™)" IEEE/MTT-S International Microwave Symposium, 2020, p. 876-879

Non-Patent Document 2: H. Zhang, H. Herdian, A. T. Narayanan, A. Shirane, M. Suzuki, K. Harasaka, K. Adachi, S. Goka, S. Yanagimachi, and K. Okada, "ULPAC: A Miniatured Ultralow-power Atomic Clock" IEEE Journal Of Solid-State Circuits, 2019, 54(11), p. 3135-3148

Non-Patent Document 3: S. Karlen, J. Gobet, T. Overstolz, J. Haesler, and S. Lecomte, "Lifetime assessment of RbN$_3$-filled MEMS atomic vapor cells with Al$_2$O$_3$ coating" Optics express, 2017, 25(3), p. 2187-2194

Non-Patent Document 4: L. Liew, J. Moreland, and V. Gerginov, "Wafer-level filling of microfabricated atomic vapor cells based on thin-film deposition and photolysis of cesium azide" Applied Physics Letters, 2007, 90(11), 114106

SUMMARY OF THE INVENTION

Problems to be Solved by the Invention

In the production method of a gas cell disclosed in Non-Patent Document 3, RbN$_3$ aqueous solution is pipetted into the cavities of a substrate where partition walls are formed to separate multiple cells, followed by drying, and the cavities are then hermetically sealed by anodic bonding of glass to the openings. The size and shape of a gas cell are required to be designed according to an atomic device to be used, whereas, in the production method of a gas cell disclosed in Non-Patent Document 3, the cell shape cannot be changed after dispensing the RbN$_3$ aqueous solution to the cells, and thus such a gas cell has less versatility.

In the production method of a gas cell disclosed in Non-Patent Document 4, a CsN$_3$ film is formed by vapor-phase film formation by vapor deposition in the cavities of a substrate where partition walls are formed to separate multiple cells, and the cavities are then hermetically sealed by anodic bonding of glass to the openings. However, even in the production method disclosed in Non-Patent Document 4, the cell shape cannot be changed after dispensing CsN$_3$ to the cells, and thus such a gas cell has less versatility. In addition, in the above vapor deposition, explosion and bumping of CsN$_3$ are likely to occur during heating, and the CsN$_3$ film formed may be non-uniform. Thus, the enclosed amount of Cs was not quantitative, and uniform unit cells could not be obtained.

The present invention has been made by focusing on the above situation, and an object of the present invention is to provide a substrate with high versatility, a method for producing the substrate, and a method for producing a unit cell using the substrate.

Solutions to the Problems

The gist of the present invention is as follows.

[1] A substrate comprising a plurality of alkali metal azide spots on a substantially flat surface.

[2] The substrate according to [1], wherein the substrate comprises a plurality of recesses scattered in a spot-like pattern on the substantially flat surface, and each of the alkali metal azide spots is formed in each of the recesses.

[3] A method for producing the substrate according to [1] or [2], wherein a coating formed from an alkali metal azide-containing liquid is formed in a spot shape on a substrate member.

[4] The method according to [3], wherein a mask having holes scattered in a spot-like pattern is formed on the substrate member, the alkali metal azide-containing liquid is applied on the mask to form the coating, and then the mask is removed.

[5] The method according to [3], wherein the alkali metal azide-containing liquid is applied to the substrate member to form the coating, and then the coating is partially removed to leave the alkali metal azide in a spot-like pattern on the substantially flat surface.

[6] A method for producing the substrate according to [2], wherein an alkali metal azide-containing liquid is applied to a substrate member so as to remain only in the recesses to form a coating formed from the alkali metal azide-containing liquid in a spot shape in each of the recesses.

[7] A method for producing a unit cell comprising the steps of:

assembling a cell assembly to laminate, on the substrate according to [1] or [2], a partition layer by which the alkali metal azide spots are separated and a second substrate facing the substrate with the partition layer interposed therebetween, vaporizing the alkali metal by irradiating the cell assembly with ultraviolet rays which decomposes the alkali metal azide, and then cutting out a unit cell from the cell assembly.

[8] The method according to [7], wherein the step of assembling the cell assembly is performed under a vacuum condition in which a buffer gas may be introduced.

Effects of the Invention

According to the present invention, it is possible to provide a substrate with high versatility, a method for producing the substrate, and a method for producing a unit cell using the substrate. In addition, the substrate can be easily produced.

BRIEF DESCRIPTION OF THE DRAWINGS

FIG. 1 is a schematic cross-sectional view showing an example of a substrate according to an embodiment of the present invention.

FIG. 2 is a schematic cross-sectional view showing an example of a member used in a production step of a substrate shown in FIG. 3.

FIG. 3 is a schematic cross-sectional view showing another example of a substrate according to an embodiment of the present invention.

FIG. 4 is a schematic cross-sectional view showing an example of a step of assembling a cell assembly in a method for producing a unit cell according to an embodiment of the present invention.

FIG. 5 is a schematic cross-sectional view showing an example of a unit cell obtained by a method for producing a unit cell according to an embodiment of the present invention.

MODE FOR CARRYING OUT THE INVENTION

Hereinafter, a substrate, a method for producing the substrate, and a method for producing a unit cell using the substrate according to the present invention will be specifically described with reference to the drawings as necessary. The present invention, however, is not limited by the following examples shown in the drawings but can also be absolutely carried out with appropriate changes to the examples within a scope in compliance with the intent of the present invention, and all the changes are to be encompassed within a technical scope of the present invention.
(Substrate 1)

As shown in FIG. 1 and FIG. 3, a substrate 1 of the present invention includes a plurality of alkali metal azide spots 2 formed on a substantially flat surface 11. In the following, the substrate is also referred to as an "alkali metal azide spot-formed substrate". A substrate prior to formation of alkali metal azide spots is also referred to as a "substrate member". In the present invention, the "substantially flat surface" of the substrate means a surface that does not have large irregularities that may serve as partition walls for separating a plurality of cells when the substrate is used to form a cell assembly. The "substantially flat surface" of the substrate may have slight irregularities that do not serve as the above partition walls. Specifically, recesses 12 having a depth of 20% or less of the thickness of the substrate may be formed to be scattered in a spot-like pattern. The alkali metal azide spot-formed substrate 1 does not have an area that serves as partition walls for separating a plurality of cells when the substrate is used to form a cell assembly. Therefore, the alkali metal azide spot-formed substrate 1 has a high degree of flexibility in designing the size and shape of a unit cell produced and has high versatility. In addition, the alkali metal azide spot-formed substrate 1 does not have the above partition walls and hence can be produced without going through a complicated step of individually introducing a raw material as an alkali metal source into each of a plurality of separated cells. Therefore, if necessary, it is possible to easily produce the alkali metal azide spot-formed substrate 1.

Since application examples of a gas cell using the alkali metal azide spot-formed substrate 1 include an atomic clock, an atomic magnetic sensor, and a quantum gyro, which utilize laser spectroscopy, a material for the substrate member 13 is preferably a transparent material having optical transparency, and more preferably glass having heat resistance.

The thickness of the substrate member 13 can be set appropriately, and is, for example, preferably 100 μm or more, and more preferably 500 μm or more from the viewpoint of strength, and is preferably 1.0 mm or less, and more preferably 0.8 mm or less from the viewpoint of light transmittance. When the substrate member 13 has the recesses 12, the thickness of the substrate member 13 refers to the thickness of an area without the recesses 12.

The alkali metal azide spots 2 are spots containing an alkali metal azide, and preferably spots composed of only an alkali metal azide. The alkali metal azide spots 2 composed of only an alkali metal azide are preferable because, when a gas cell is produced using the alkali metal azide spot-formed substrate 1, impurities that can adsorb a buffer gas are not generated in the cell. If a buffer gas in the cell is adsorbed to impurities, the internal pressure in the cell may change, which may result in a shift in the frequency of an electromagnetic wave absorbed by an alkali metal and a change in the temperature characteristics of an alkali metal.

Examples of the alkali metal azide include lithium azide, sodium azide, potassium azide, rubidium azide, and cesium azide. Among these, rubidium azide and cesium azide are preferred, and rubidium azide is more preferred. The transition frequency of rubidium atoms is lower than that of cesium atoms. When a gas cell using the alkali metal azide spot-formed substrate 1 is used in an atomic clock or the like, if the alkali metal azide is rubidium azide, the power consumption of the electronic circuit can be kept low.

Since alkali metal azides are stable substances at ordinary temperatures and ordinary pressures, the alkali metal azide spot-formed substrate 1 can be stored and transported at ordinary temperatures and ordinary pressures.

The shape of the alkali metal azide spots 2 is not particularly limited, and may be, for example, circular, elliptical, or polygonal. The size of the alkali metal azide spots 2 can be set appropriately, but the circle-equivalent diameter of the alkali metal azide spots 2 is preferably 50 μm or more, more preferably 100 μm or more, and still more preferably 200 μm or more, and is preferably 2.0 mm or less, and more preferably 1.5 mm or less.

The plurality of alkali metal azide spots 2 may have the same shape and size or different shapes and sizes, but preferably have the same shape and size. If the plurality of alkali metal azide spots 2 have the same shape and size, unit cells that are uniform in enclosed amount of the alkali metal can be easily produced using the alkali metal azide spot-formed substrate 1. More preferably, the plurality of the alkali metal azide spots 2 are formed as a uniform pattern.

When the substrate member 13 has a plurality of recesses 12 scattered in a spot-like pattern on the substantially flat surface 11, each of the alkali metal azide spots 2 may be formed in each of the recesses 12.

The shape of the recesses 12 is not particularly limited, and may be, for example, a bowl, bottomed circular columnar, bottomed polygonal prismatic, inverted-conical, or inverted-polygonal pyramidal shape (a bottomed columnar shape in the illustrated example). The size of the recesses 12 can be set appropriately, but the outer diameter of the recesses 12 is, as a circle-equivalent diameter, for example, preferably 50 µm or more, more preferably 100 µm or more, and still more preferably 200 µm or more, and is preferably 2.0 mm or less, and more preferably 1.5 mm or less. The depth of the recesses 12 is preferably 1 µm or more, more preferably 10 µm or more, and still more preferably 20 µm or more from the viewpoint of reliably retaining the alkali metal azide-containing liquid in the recesses 12 in the formation of alkali metal azide spots 2 as described later; and is preferably 200 µm or less, more preferably 150 µm or less, and still more preferably 100 µm or less from the viewpoint of ensuring that the surface 11 is substantially flat. The ratio of the depth of the recesses 12 to the thickness of the substrate member 13 is preferably 0.1% or more, more preferably 1% or more, and still more preferably 10% or more, and is preferably 20% or less, more preferably 18% or less, and still more preferably 15% or less.

The shape and size of the plurality of recesses 12 may be the same or different, but are preferably the same. If the shape and size of the plurality of recesses 12 are the same, the shape and size of the plurality of alkali metal azide spots 2 can be easily made the same, and unit cells that are uniform in enclosed amount of the alkali metal can be easily produced using the alkali metal azide spot-formed substrate 1.

(Method for Producing Alkali Metal Azide Spot-Formed Substrate 1)

The substrate 1 having the plurality of alkali metal azide spots 2 formed on the substantially flat surface 11 (alkali metal azide spot-formed substrate) can be produced by forming a coating formed from an alkali metal azide-containing liquid in a spot shape on the substrate member 13 having the substantially flat surface 11.

Examples of the alkali metal azide-containing liquid include a solution in which an alkali metal azide is dissolved and a dispersion liquid in which an alkali metal azide is dispersed. A solution in which an alkali metal azide is dissolved is preferred because it is easier to make the contents of an alkali metal azide in the plurality of alkali metal azide spots 2 more uniform.

Examples of a solvent for the alkali metal azide-containing liquid include water, methanol, ethanol, isopropyl alcohol, acetonitrile, acetone, N-methylpyrrolidone, dimethyl sulfoxide, and N,N-dimethylformamide. Among these, water or methanol is preferred, and methanol is more preferred.

The concentration of the alkali metal azide in the alkali metal azide-containing liquid is not particularly limited, and is, for example, preferably 0.5% by weight or more, and more preferably 1.0% by weight or more, and is preferably 15% by weight or less, and more preferably 10% by weight or less. If the concentration of the alkali metal azide is within the above range, a cell in which an alkali metal in an amount suitable for use in an atomic device is enclosed can be easily produced.

As a method of forming the coating formed from the alkali metal azide-containing liquid in a spot shape on the substrate member 13, a method in which the alkali metal azide-containing liquid is dropped in appropriate amounts in a spot shape using an inkjet machine or dispenser can be given, but the following formation methods A, B and C are preferably given. The formation methods A, B, and C become enabled by the substrate member 13 having no large irregularities that may serve as partition walls for separating a plurality of cells when forming a cell assembly. By the formation methods A, B, and C, the alkali metal azide spot-formed substrate 1 can be easily produced without a complicated process of individually introducing a raw material into each of a plurality of separated cells.

((Formation Method A))

The formation method A is a method in which a mask (mask layer) having holes scattered in a spot-like pattern is formed on the substantially flat surface 11 of the substrate member 13, the alkali metal azide-containing liquid is applied on the mask to form a coating, and then the mask is removed.

In the formation method A, the mask having holes scattered in a spot-like pattern is not particularly limited as long as it can be removed in a later step. The mask may be an adhesive tape with holes scattered in a spot-like pattern and may be a mask formed by generally called a lift-off method using a photoresist and a photomask.

The application of the alkali metal azide-containing liquid in the formation method A may be performed using a coating machine such as a spin coater, and is performed so that a coating (that is, alkali metal azide spots 2) having a uniform thickness can be obtained after drying mentioned later. When the dried coating has a uniform thickness, unit cells that are uniform in enclosed amount of an alkali metal can be easily produced using the alkali metal azide spot-formed substrate 1.

The formation of the coating in the formation method A is performed by removing, in other words, drying the liquid component in the alkali metal azide-containing liquid. The drying method is not particularly limited, but drying by heating with hot air, a hot plate, or the like can be given.

The removal of the mask in the formation method A can be performed by a suitable method selected according to the formed mask. For example, when an adhesive tape with holes scattered in a spot-like pattern is used to form the mask, the adhesive tape may be peeled off so that no adhesive remains.

((Formation Method B))

The formation method B is a method in which the alkali metal azide-containing liquid is applied on the substantially flat surface 11 of the substrate member 13 to form a coating, and then the coating is partially removed to leave the alkali metal azide in a spot-like pattern on the substantially flat surface 11.

The application of the alkali metal azide-containing liquid and the formation of the coating in the formation method B are the same as the application of the alkali metal azide-containing liquid and the formation of the coating in the formation method A.

In the formation method B, as a method of partially removing the coating and leaving the alkali metal azide in a spot-like pattern on the substantially flat surface 11, a method using a photoresist and a photomask, which is generally called an etching method, can be given.

((Formation Method C))

The formation method C is a method in which the alkali metal azide-containing liquid is applied on the substantially flat surface 11 of the substrate member 13 having a plurality of recesses 12 shown in FIG. 2 so as to remain only in the recesses 12 to form a coating in each of the recesses 12.

The substrate member 13 used in the formation method C has a plurality of recesses 12 formed in advance on at least one side thereof. The method of forming the recesses 12 is not particularly limited, and any method that can form a plurality of uniform recesses 12 may be used. Examples thereof include a method of processing with an ultrashort pulse laser and a chemical etching method. Examples and preferred embodiments of the shape and size of the recesses 12 to be formed are the same as those described for the recesses 12 in the description on the substrate 1 mentioned above.

The application of the alkali metal azide-containing liquid in the formation method C may be performed using a coating machine such as a spin coater, and is performed so that the alkali metal azide-containing liquid remains only in the recesses 12 of the substrate member 13. As a method of leaving the alkali metal azide-containing liquid only in the recesses 12 of the substrate member 13, for example, when a spin coater is used for the application, a rotary centrifugal force of the spin coater may be used to remove excess liquid other than the liquid in the recesses 12, or the substrate member 13 coated with the alkali metal azide-containing liquid may be tilted obliquely or turned vertically to remove excess liquid other than the liquid in the recesses 12.

When the substrate member 13 has the plurality of recesses 12, the formation of a mask prior to formation of the coating and the step of partially removing the formed coating are not necessary.

The formation of the coating in the formation method C is the same as the formation of the coating in the formation method A.

(Method for Producing Unit Cell 7)

The method for producing a unit cell 7 shown in FIG. 5 includes steps of assembling a cell assembly 5 to laminate a partition layer 3 by which the alkali metal azide spots 2 are separated and a second substrate 4 facing the alkali metal azide spot-formed substrate 1 with the partition layer 3 interposed therebetween as shown in FIG. 4, vaporizing the alkali metal by irradiating the cell assembly 5 with ultraviolet rays which decomposes the alkali metal azide, and then cutting out a unit cell from the cell assembly 5. A conventional substrate which has partition walls for separating cells and on which an alkali metal raw material is placed has a low degree of flexibility in designing a unit cell. However, by using the alkali metal azide spot-formed substrate 1, the shape of the partition layer 3 can be appropriately designed according to the use of a cell, and therefore, the unit cell 7 having any desired size and shape can be produced.

((Step of Assembling Cell Assembly 5))

The cell assembly 5 is a laminate structure in which the alkali metal azide spot-formed substrate 1 and the second substrate 4 are bonded via the partition layer 3. By sealing through holes 31 of the partition layer 3 with the alkali metal azide spot-formed substrate 1 and the second substrate 4, internal spaces 6 of the cells are formed as airtight spaces.

The partition layer 3 serves to separate the alkali metal azide spots 2 and is a plate-like member having a plurality of through holes 31 in the thickness direction.

A material for the partition layer 3 is not particularly limited, and examples thereof include glass, metals, resins, and silicones. Glass and silicones, which are suitable for microfabrication by etching or the like, are preferable, and silicones are more preferable.

A thickness "a" (see FIG. 4) of the partition layer 3 can be appropriately set, but is preferably 0.1 mm or more, and more preferably 0.3 mm or more, and is preferably 5.0 mm or less, and more preferably 3.0 mm or less.

The through holes 31 of the partition layer 3 can be formed by performing microfabrication by etching, blasting treatment, or the like. The size and shape of the through holes 31 can be appropriately set as long as the partition layer 3 and the alkali metal azide spots 2 of the alkali metal azide spot-formed substrate 1 do not overlap when the cell assembly 5 is assembled. Therefore, the unit cell 7 produced can have a desired size and shape according to the use of the cell.

Since a cell using the second substrate 4 is used in atomic clocks, atomic magnetic sensors, and the like, a material for the second substrate 4 is preferably a transparent member having optical transparency, and more preferably glass having heat resistance.

The thickness of the second substrate 4 can be set appropriately, but, for example, is preferably 80 μm or more, and more preferably 100 μm or more, and is preferably 1.0 mm or less, and more preferably 0.8 mm or less.

The method of bonding the partition layer 3 to the alkali metal azide spot-formed substrate 1 and the second substrate 4 can be appropriately selected according to the materials thereof, and is not particularly limited. Examples of the method of bonding them include anodic bonding, direct bonding, and surface activated bonding. The anodic bonding is preferred because it allows easily airtight bonding.

Since an elemental alkali metal is oxidized in a short time in the presence of oxygen and moisture, bonding of the partition layer 3 to the alkali metal azide spot-formed substrate 1 and the second substrate 4 (especially, bonding to form the internal spaces 6 of the cells as airtight spaces) is preferably performed under a vacuum condition such as in a vacuum chamber. When an elemental alkali metal in the cell collides with the inner wall of the cell, the internal state of the alkali metal atom may change. Therefore, it is preferable to enclose a buffer gas inside the cells, and it is preferable to perform bonding of the partition layer 3 to the alkali metal azide spot-formed substrate 1 and the second substrate 4 (especially, bonding to form the internal spaces 6 of the cells as airtight spaces) in a buffer gas atmosphere created by introducing a buffer gas under a vacuum condition. Examples of the buffer gas include inert gases such as nitrogen gas, neon gas, argon gas, and a mixed gas of nitrogen gas and argon gas.

The order of bonding the partition layer 3 to the alkali metal azide spot-formed substrate 1 and the second substrate 4 is not particularly limited. The partition layer 3 may be bonded to the second substrate 4 and then bonded to the alkali metal azide spot-formed substrate 1, the partition layer 3 may be bonded to the alkali metal azide spot-formed substrate 1 and then bonded to the second substrate 4, or the partition layer 3 may be bonded to the alkali metal azide spot-formed substrate 1 and to the second substrate 4 at the same time. When the partition layer 3 is bonded to the alkali metal azide spot-formed substrate 1, the alkali metal azide spots 2 of the alkali metal azide spot-formed substrate 1 and the through holes 31 of the partition layer 3 are aligned with each other such that the alkali metal azide is not present on the bonding faces. By making the number of the alkali metal azide spots 2 accommodated in the through holes 31 of the partition layer 3 the same between the through holes 31, unit cells 7 that are uniform in enclosed amount of an alkali metal can be produced.

((Step of Vaporizing Alkali Metal Azide))

The cell assembly 5 is irradiated with energy rays such as ultraviolet rays to vaporize by decomposing (reducing) the alkali metal azide, thereby generating an alkali metal gas in the internal spaces 6 of the cells separated by the alkali metal azide spot-formed substrate 1, the partition layer 3, and the second substrate 4. Although nitrogen gas is also generated by the above decomposition, nitrogen gas is an inert gas and thus can be used as a buffer gas. Therefore, if the raw material of the alkali metal is an alkali metal azide, no impurities other than an alkali metal gas and nitrogen gas serving as a buffer gas are generated, and thus the possibility that the properties of the alkali metal in the cells will change can be reduced.

((Step of Cutting out Unit Cell 7))

The cell assembly 5 can be separated along the dashed lines X shown in FIG. 4 by blade dicing, laser dicing, water dicing, or the like to cut out the unit cell 7.

The unit cell 7 produced as described above can be used in atomic devices such as atomic clocks and atomic magnetic sensors.

The present application claims priority based on Japanese Patent Application No. 2021-039388 filed on Mar. 11, 2021. All the contents described in Japanese Patent Application No. 2021-039388 filed on Mar. 11, 2021 are incorporated herein by reference.

REFERENCE SIGNS LIST

1: substrate (alkali metal azide spot-formed substrate)
11: substantially flat surface
12: recess
13: substrate member
2: alkali metal azide spot
3: partition layer
31: through hole
4: second substrate
5: cell assembly
6: internal space of cell
7: unit cell
a: thickness of partition layer

The invention claimed is:

1. A substrate comprising a plurality of alkali metal azide spots on a substantially flat surface,
    wherein the substantially flat surface is a surface having no partition walls and optionally including recesses having a depth of 20% or less of a thickness of the substrate.

2. The substrate according to claim 1, wherein the substrate comprises a plurality of the recesses scattered in a spot-like pattern on the substantially flat surface, and each of the alkali metal azide spots is formed in each of the recesses.

3. A method for producing the substrate according to claim 1, wherein a coating formed from an alkali metal azide-containing liquid is formed in a spot shape on a substrate member.

4. The method according to claim 3, wherein a mask having holes scattered in a spot-like pattern is formed on the substrate member, the alkali metal azide-containing liquid is applied on the mask to form the coating, and then the mask is removed.

5. The method according to claim 3, wherein the alkali metal azide-containing liquid is applied to the substrate member to form the coating, and then the coating is partially removed to leave the alkali metal azide in a spot-like pattern on the substantially flat surface.

6. A method for producing the substrate according to claim 2, wherein an alkali metal azide-containing liquid is applied to a substrate member so as to remain only in the recesses to form a coating formed from the alkali metal azide-containing liquid in a spot shape in each of the recesses.

7. The substrate according to claim 1, wherein the thickness of the substrate is from 100 μm to 1.0 mm.

8. The substrate according to claim 1, wherein each alkali metal azide spot is a spot composed only of an alkali metal azide.

9. The substrate according to claim 1, wherein a circle-equivalent diameter of each alkali metal azide spot is from 50 μm to 2.0 mm.

10. The substrate according to claim 1, wherein the plurality of alkali metal azide spots have the same shape and size.

11. The substrate according to claim 2, wherein an outer diameter of each recess, in terms of circle-equivalent diameter, is from 50 μm to 2.0 mm.

12. The substrate according to claim 2, wherein the depth of each recess is from 1 μm to 200 μm.

13. The substrate according to claim 2, wherein the plurality of recesses have the same shape and size.

14. A unit cell formed from the substrate according to claim 1.

* * * * *